(12) United States Patent
Suzuki

(10) Patent No.: US 6,838,935 B2
(45) Date of Patent: Jan. 4, 2005

(54) SIGNAL AMPLIFIER

(75) Inventor: Koji Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/397,304

(22) Filed: Mar. 27, 2003

(65) Prior Publication Data
US 2004/0061553 A1 Apr. 1, 2004

(30) Foreign Application Priority Data
Oct. 1, 2002 (JP) ........................................ 2002-288665

(51) Int. Cl.⁷ .............................................. H03F 3/45
(52) U.S. Cl. ...................................... 330/69; 330/252
(58) Field of Search .......................... 330/69, 252, 75, 330/109

(56) References Cited
U.S. PATENT DOCUMENTS 6,078,215 A * 6/2000 Fiori, Jr. ..................... 330/69
6,329,876 B1 * 12/2001 Llewellyn .................... 330/69
6,448,856 B2 * 9/2002 Noro et al. .................. 330/284

FOREIGN PATENT DOCUMENTS
JP           09-223933           8/1997

* cited by examiner

Primary Examiner—Khanh Van Nguyen
(74) Attorney, Agent, or Firm—Rabin & Berdo, P.C.

(57) ABSTRACT

The signal amplifier of this invention includes a noise amplifier that amplifies a difference between a first ground potential and a second ground potential, and an adding amplifier that superposes an analog input signal on an output potential of the noise amplifier, and amplifies a difference between the first ground potential and a potential having the analog input signal and the output potential superposed. Thus, the adding amplifier superposes the noises amplified by the noise amplifier on the analog input signal, and thereafter amplifies the difference between the first ground potential and the potential thus superposed. Thereby, the signal amplifier is able to amplify only the analog input signal, without amplifying the noises of the first ground potential or the second ground potential.

24 Claims, 6 Drawing Sheets

TIME (MILI SECOND)

SIGNAL AMPLIFIER

FIELD OF THE INVENTION

The present invention relates to a signal amplifier that amplifies an analog input signal. The invention is applicable, for example, to a signal amplifier that amplifies a minute analog signal of the audio signal band, such as a microphone input signal.

BACKGROUND OF THE INVENTION

Traditionally, the amplifier using an operational amplifier is well known as a means that amplifies a minute analog signal such as a microphone input signal. There are an inverted amplifier and a non-inverted amplifier as the amplifier using an operational amplifier, which is well known.

In the inverted amplifier, the inverted input terminal of the operational amplifier inputs a minute analog signal through an input resistor. The non-inverted input terminal of this operational amplifier inputs a signal ground potential. The output terminal and the inverted input terminal of this operational amplifier are connected through a feedback resister.

In the non-inverted amplifier, the inverted input terminal of the operational amplifier inputs a signal ground potential through an input resister. The non-inverted input terminal of this operational amplifier inputs the minute analog signal. The output terminal and the inverted input terminal of this operational amplifier are connected through a feedback resister.

If a very large gain is desired, it is only needed to cascade two or more inverted amplifiers or non-inverted amplifiers.

As mentioned above, in the amplifier using an operational amplifier (inverted amplifier or non-inverted amplifier), one of the inverted input terminal or the non-inverted input terminal inputs a minute analog signal, and the other one inputs a signal ground potential. And, the difference of the minute analog signal and the signal ground potential is amplified. Accordingly, if the signal ground potential has noises superposed, this operational amplifier amplifies the noises as well.

And, the minute analog signal such as a microphone input signal is generated by means of a signal generator provided in the pre-stage of the amplifier. Normally, this signal generator generates the signal by using a signal ground line different from what is used for the amplifier. When the signal ground potential of the signal generator has noises superposed, the output of this signal generator (namely, the minute analog signal) has the noises superposed as well. These noises are also amplified through the operational amplifier of the amplifier, in the same manner as the noises of the amplifier.

In order to ensure a sufficient quality of the minute analog signal, the amplifier is preferably configured not to amplify the noises on the signal ground line of the amplifier and the signal generator.

SUMMARY OF THE INVENTION

The signal amplifier of the present invention includes a noise amplifier that amplifies the difference between a first ground potential and a second ground potential, and an adding amplifier that superposes an analog input signal on an output potential of the noise amplifier, and amplifies the difference between this superposed potential and the first ground potential. By means of this configuration, the noises amplified by the noise amplifier are superposed on the input signal, and thereafter differentially amplified, which makes it possible to amplify only the analog input signal without amplifying the noises of the first ground potential or the second ground potential.

PREFERRED EMBODIMENTS OF THE INVENTION

The embodiments will be described with reference to the accompanying drawings. Here, the drawings only s chematically illustrate the sizes, the shapes, and the locations of the components to such a degree that the reader will understand the concept of this invention. And, the numerical conditions explained hereunder are only the examples.

[First Embodiment]

The first embodiment will be described with reference to FIG. 1 through FIG. 4.

Figure 1:
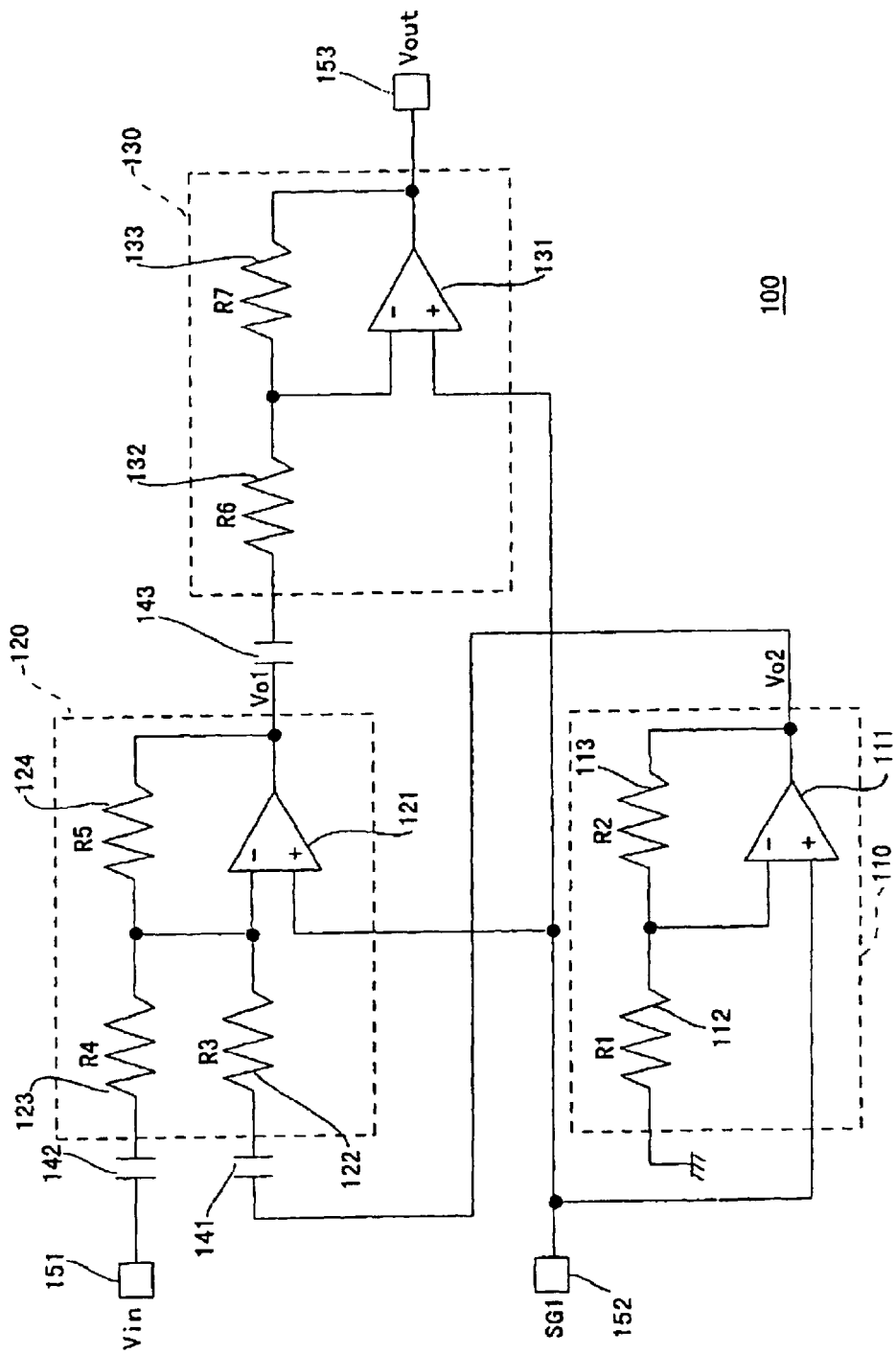
FIG. 1 illustrates a circuit configuration of a signal amplifier relating to a first embodiment.

FIG. 1 illustrates a circuit configuration of a signal amplifier relating to the first embodiment. As illustrated in FIG. 1, a signal amplifier 100 includes a noise amplifier 110, an adding amplifier 120, an amplifier 130, capacitors 141 through 143, a minute analog signal input terminal 151, a signal ground potential input terminal 152, and an analog signal output terminal 153.

The noise amplifier 110 is a non-inverted amplifier that amplifies noises of the signal ground potential. The noise amplifier 110 includes an operational amplifier 111, an input resister 112, and a feedback resister 113. Here, the resistance of the input resistor 112 is R1, and the resistance of the feedback resistor 113 is R2. The non-inverted input terminal of the operational amplifier 111 is connected to the signal ground potential input terminal 152. The inverted input terminal of the operational amplifier 111 is grounded through the input resistor 112. The output terminal of the operational amplifier 111 is connected to the inverted input terminal through the feedback resistor 113.

The adding amplifier 120 is an inverted adding amplifier that inversely amplifies the sum of the output from the noise amplifier 111 and the minute analog signal Vin. The adding amplifier 120 includes an operational amplifier 121, input resistors 122, 123, and a feedback resistor 124. Here, the resistances of the resistors 122, 123, and 124 are R3, R4, and R5, respectively. The non-inverted input terminal of the operational amplifier 121 is connected to the signal ground potential input terminal 152. The inverted input terminal of the operational amplifier 121 is connected to one-side ends of the input resistors 122 and 123. The other end of the input resistor 122 is connected to the output terminal of the operational amplifier 111 through the capacitor 141. The other end of the input resistor 123 is connected to the minute analog signal input terminal 151 through the capacitor 142. And, the output terminal of the operational amplifier 121 is connected to the inverted input terminal of the same amplifier 121 through the feedback resistor 124.

The amplifier 130 is an inverted amplifier that further amplifies the minute analog signal amplified by the adding amplifier 120. The amplifier 130 includes an operational amplifier 131, an input resistor 132, and a feedback resistor 133. The resistance of the input resistor 132 is R6, and the resistance of the feedback resistor 133 is R7. The non-inverted input terminal of the operational amplifier 131 is connected to the signal ground potential input terminal 152. The inverted input terminal of the operational amplifier 131 is connected to one-side end of the input resistor 132. And, the other end of the input resistor 132 is connected to the output terminal of the operation amplifier 121 through the capacitor 143. On the other hand, the output terminal of the operational amplifier 131 is connected to the inverted input terminal of the same amplifier 131 through the feedback resistor 133. Further, the output terminal of the operational amplifier 131 is connected to the analog signal output terminal 153.

Here, the resistances R1 through R5 of the resistors 112, 113, 122, 123, and 124 are determined to satisfy the following expression (1). According to this determination, the gain to the noises superposed on the signal groundpotential SG1 can be set to '1' (described later). Here, 'R3//R4' signifies the combined resistance of R3 and R4.

$$R5/(R3//R4)=(R5/R3)\times(1+R2/R1) \quad (1)$$

The operational theory of the signal amplifier illustrated in FIG. 1 will be explained.

The noise amplifier 110 inputs the signal ground potential SG1 from the input terminal 152, and amplifies the noises superposed on this signal ground potential SG1. The noise amplifier 110 is a non-inverted amplifier. The gain of the non-inverted amplifier is given by '1+(feedback resistance/input resistance)', which is very well known. Therefore, the gain of the noise amplifier 110 is given by '1+R2/R1'. Provided that the amplitude of the noises is given by SG1(AC), the alternate current component Vo2(AC) at the output V02 of the noise amplifier 110 is expressed by the following expression (2).

$$Vo2(AC)=(1+R2/R1)\times SG1(AC) \quad (2)$$

As mentioned above, the adding amplifier 120 amplifies the sum of the output signal V02 of the noise amplifier 110 and the alternate current component Vin(AC) of the minute analog signal Vin. The adding amplifier forms an inverted amplifier. The gain of the inverted amplifier is given by '–(feedback resistance/input resistance)', which is also well known.

Here, let's consider a case that the amplitude of the AC component Vin(AC) of the minute analog signal is zero, the amplitude of the non-inverted input SG1(AC) of the operational amplifier 121 is zero, and the amplitude of the signal Vo2(AC) is not zero. In this case, the adding amplifier 120 is equivalent to an inverted amplifier that amplifies the signal Vo2(AC) in a state that the amplitude of the signal ground potential is null. Therefore, the output AC component Vo1(AC) of the adding amplifier 120 is given by the following expression (3).

$$Vo1(AC)=-(R5/R3)\times Vo2(AC) \quad (3)$$

To substitute the expression (2) for the expression (3) will produce the following expression (4).

$$Vo1(AC)=-(R5/R3)\times(1+R2/R1)\times SG1(AC) \quad (4)$$

Further, to substitute the expression (1) for the expression (4) will produce the following expression (5).

$$Vo1(AC)=-(R5/(R4//R3))\times SG1(AC) \quad (5)$$

Subsequently, let's consider a case that the amplitudes of the signal Vin(AC) and Vo2(AC) are zero and the amplitude of the non-inverted input signal SG1(AC) is not zero. In this case, the adding amplifier 120 is equivalent to a non-inverted amplifier that amplifies the signal SG1(AC) in a state that the amplitude of the signal ground potential is null. Therefore, the AC output Vo1(AC) of the adding amplifier 120 is given by the following expression (6).

$$Vo1(AC)=(1+R5/(R3//R4))\times SG1(AC) \quad (6)$$

Next, let's consider a case that the amplitudes of the signal Vo2(AC) and the signal SG1(AC) are zero and the amplitude of the minute analog signal Vin(AC) is not zero. In this case, the adding amplifier 120 is an inverted amplifier that amplifies the AC component Vin(AC) of the minute analog signal in a state that the signal ground potential is null. Therefore, the AC output Vo1(AC) of the adding amplifier 120 is given by the following expression (7).

$$Vo1(AC)=-R5/R4\times Vin(AC) \quad (7)$$

In case of the signals Vin(AC), Vo2(AC), and SG1(AC) being not zero, the AC output Vo1(AC) of the adding amplifier 120 is given by the sum of the right sides of the expressions (4), (5), and (6), namely, the following expression (8).

$$Vo1(AC)=-R3/R1\times Vin(AC)+SG1(AC) \quad (8)$$

The expression (8) shows that the adding amplifier 120 does not amplify the AC component SG1(AC) of the signal ground potential SG1 (namely, the noises of the signal ground potential SG1), but amplifies only the AC component Vin(AC) of the minute analog signal Vin.

Next, the output Vout of the inverted amplifier 130 will be examined.

In the first place, let's consider a case that the output AC component Vo1(AC) of the adding amplifier 120 is zero, and the AC component SG1(AC) of the signal ground potential SG1 is not zero. In this case, the amplifier 130 is equivalent to a non-inverted amplifier that amplifies the signal SG1 (AC). Therefore, the output AC component Vout (AC) is given by the following expression (9).

$$Vout(AC)=(1+R7/R6)\times SG1(AC) \quad (9)$$

Next, let's consider a case that the output AC component Vo1(AC) of the adding amplifier 120 is not zero, and the AC component SG1(AC) of the signal ground potential SG1 is zero. In this case, the amplifier 130 is equivalent to an inverted amplifier that amplifies the signal Vo1(AC). Therefore, the output AC component Vout(AC) is given by the following expression (10).

$$Vout(AC)=-R7/R6\times Vo1(AC) \quad (10)$$

When the signals Vo1(AC) and SG1(AC) are not zero, the output AC component. Vout(AC) is given by the sum of the right sides of the expressions (9) and (10). That is, the output AC component Vout(AC) is given by the following expression (11).

$$Vout(AC)=(1+R7/R6)\times SG1(AC)-R7/R6\times Vo1(AC) \quad (11)$$

Now, substituting the expression (8) for the expression (11) will eliminate Vo1(AC), thereby attaining the following expression (12).

$$\text{Vout(AC)} = R5/R4 \times R7/R6 \times \text{Vin(AC)} + SG1(AC) \tag{12}$$

The expression (12) shows that the signal amplifier 100 relating to the first embodiment does not amplify the noises SG1(AC) of the signal ground potential SG1, but amplifies only the AC component Vin(AC) of the minute analog signal Vin.

Next, the simulation result of operations of the signal amplifier 100 relating to the first embodiment will be explained, compared with the simulation result of operations of a circuit for comparison.

Figure 2:
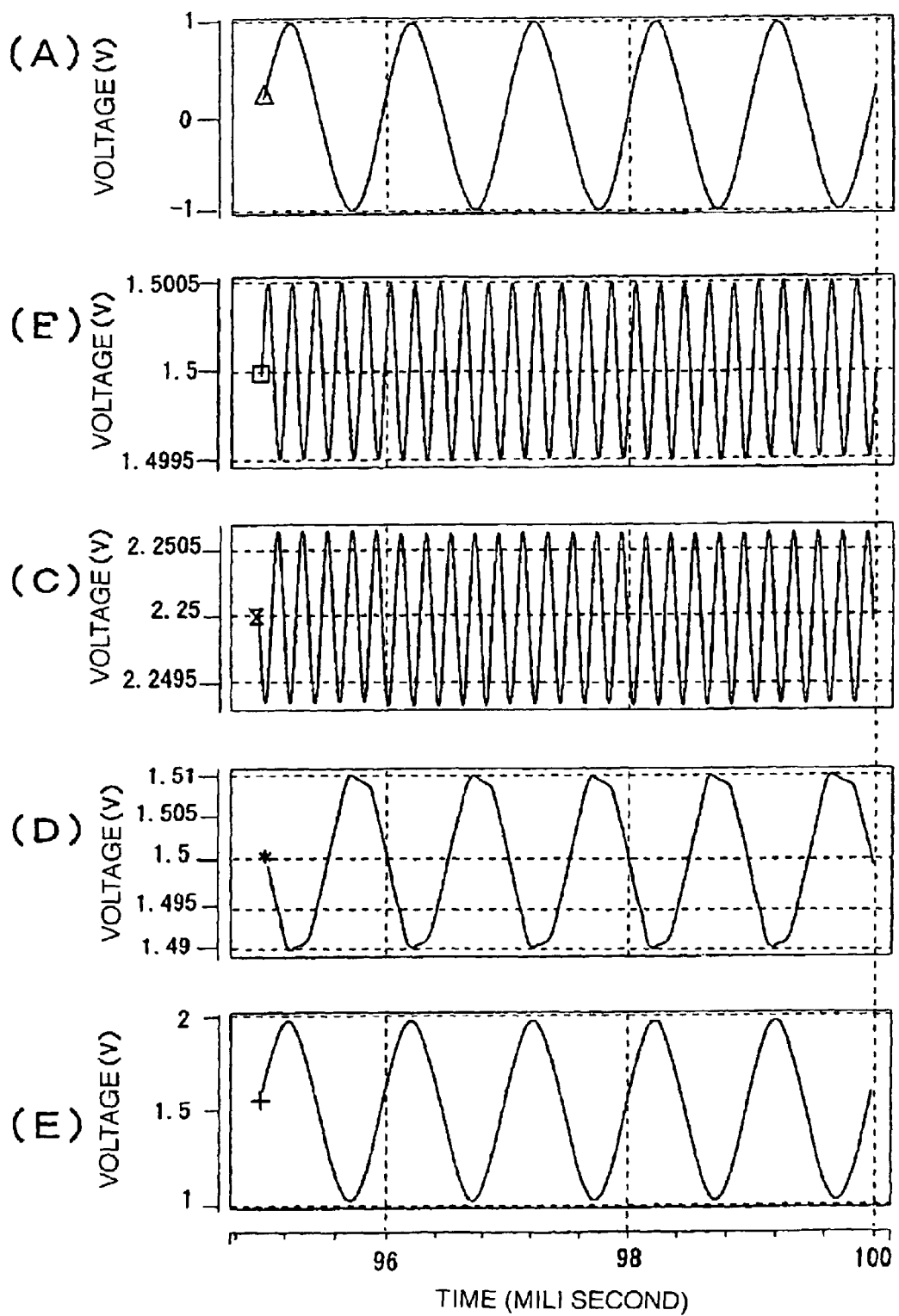
FIG. 2A through FIG. 2E illustrate signal waveforms showing a simulation result of operations of the signal amplifier relating to the first embodiment.

FIG. 2 is to explain the simulation result of operations of the signal amplifier 100 relating to the first embodiment, in which FIG. 2A illustrates a waveform of the minute analog signal Vin, FIG. 2B a waveform of the signal ground potential SG1, FIG. 2C an output waveform of the noise amplifier 110, FIG. 2D an output waveform of the adding amplifier 120, and FIG. 2E a waveform of the output signal Vout. In FIG. 2A through FIG. 2E, the horizontal axis represents the time, and the vertical axis represents the voltage. Here, the simulation in FIG. 2 applied the sine wave of the frequency 1 kHz and the amplitude ±1 mV to the minute analog signal Vin. As to the signal ground potential SG1, the DC component was set to 1.5 V, and the AC component (noises) was made up with the frequency 5 kHz and the amplitude ±0.5 mV. Further, the resistances of the resistors were set as: R1=200 kΩ, R2=100 kΩ, R3=10 kΩ, R4=20 kΩ, R5=200 kΩ, R6=10 kΩ, and R7=500 kΩ.

Figure 3:
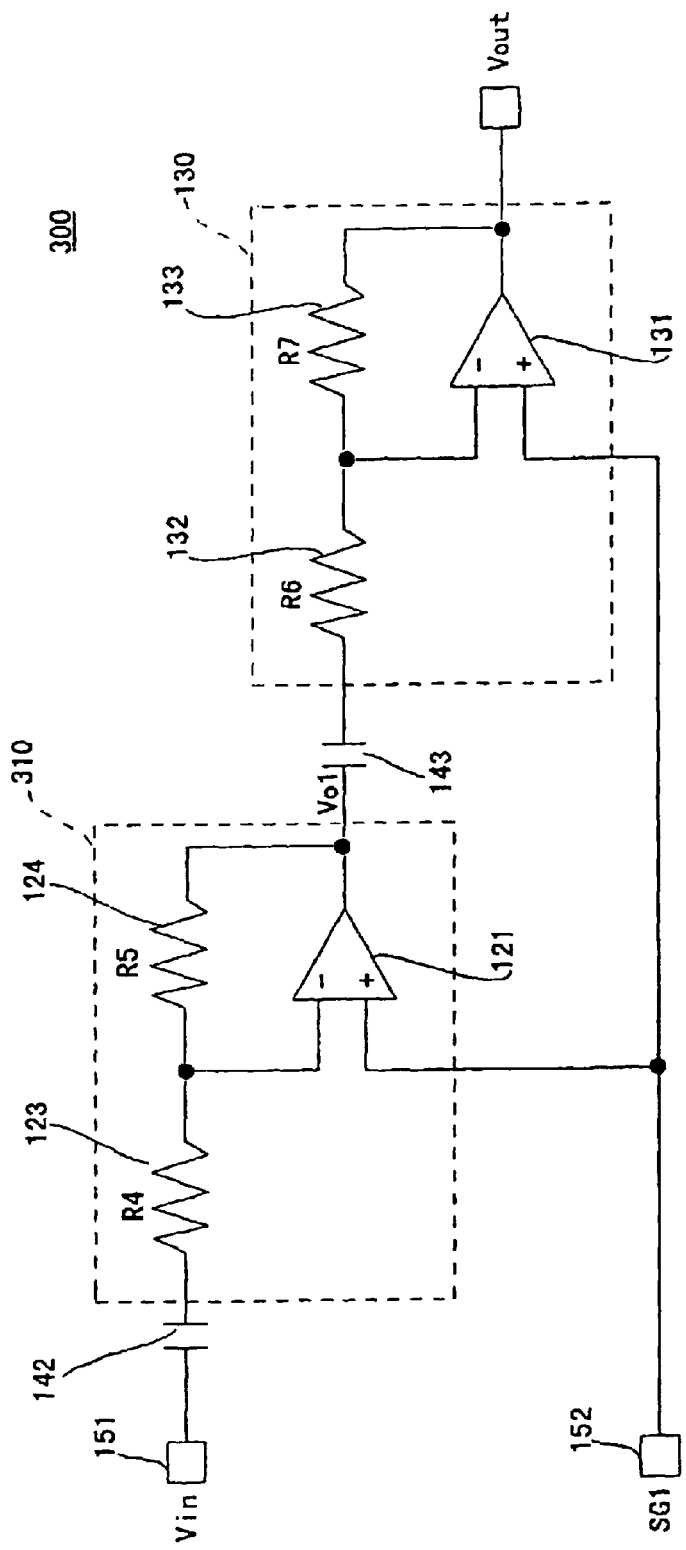
FIG. 3 illustrates a circuit configuration of a signal amplifier for comparison.

FIG. 3 illustrates a circuit configuration of a signal amplifier 300 for comparison. In FIG. 3, the components given the same symbols as those in FIG. 1 each show the same ones as those of the circuit in FIG. 1. The signal amplifier 300 is configured with two-stage inverted amplifiers simply cascaded. That is, the signal amplifier 300 is not furnished with the noise amplifier. An inverted amplifier 310 does not contain the resistor 122 for adding amplified noises, and it differs from the adding amplifier 120 in FIG. 1, in this regard.

Figure 4:
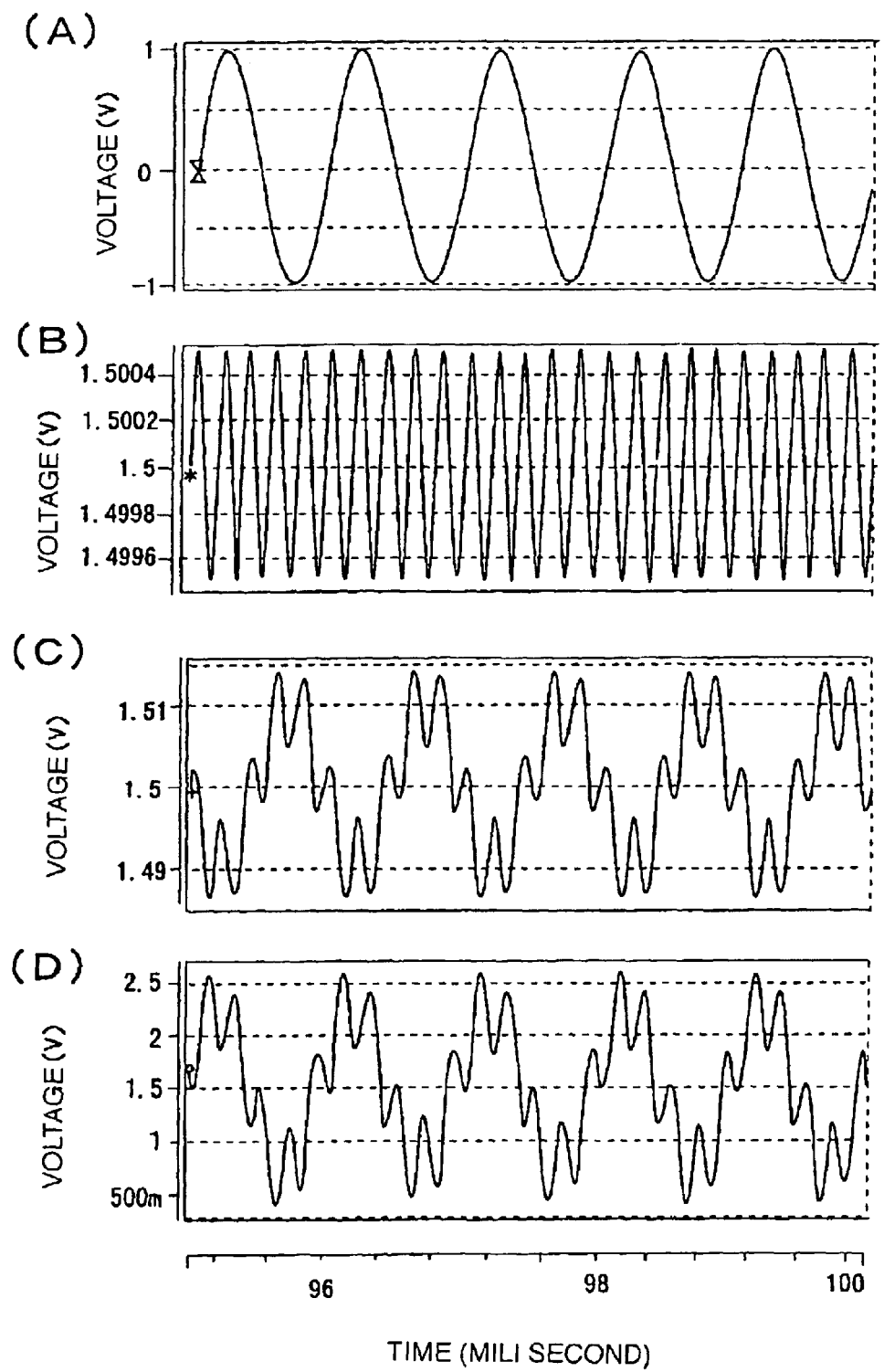
FIG. 4A through FIG. 4D illustrate signal waveforms showing a simulation result of operations of the signal amplifier as shown in FIG. 3.

FIG. 4 is to explain the simulation result of operations of the signal amplifier 300 shown in FIG. 3, in which FIG. 4A illustrates a waveform of the minute analog signal Vin, FIG. 4B a waveform of the signal ground potential SG1, FIG. 4C an output waveform of the inverted amplifier 310, and FIG. 4D a waveform of the output signal Vout. In FIG. 4A through FIG. 4D, the horizontal axis represents the time, and the vertical axis represents the voltage. Here, the simulation in FIG. 4 used the same signals as those in FIG. 2 for the minute analog signal Vin and the signal ground potential SG1, and the resistances of the resistors R3 through R7 are set to the same as in FIG. 2.

In case of the signal amplifier 300, even if the minute analog signal Vin does not have noises superposed thereon (see FIG. 4A), if the signal ground potential SG1 has noises superposed (see FIG. 4B), the output waveform of the inverted amplifier 310 is deteriorated (see FIG. 4C). The output signal of the inverted amplifier 310 is amplified by the inverted amplifier 130, and is outputted with the waveform deteriorated.

In contrast to this, in case of the signal amplifier 100 relating to the first embodiment, the noises of the signal ground potential SG1 (see FIG. 2B) are amplified by the noise amplifier 110 (see FIG. 2C). The amplified noises are superposed on the minute analog signal Vin (see FIG. 2A) inside the adding amplifier 120, which are thereafter amplified. Accordingly, the output Vo1 of the adding amplifier 120 forms a waveform that does not substantially contain distortions (see FIG. 2D). The amplifier 130 further amplifies the output Vo1 of the adding amplifier 120. As mentioned above, the signal amplifier 100 does not amplify the noises (see FIG. 2B), but amplifies only the output signal Vo1 of the adding amplifier 120. Therefore, if the gain of the signal amplifier 100 is sufficiently high, the noise component SG1(AC) of the output signal Vout becomes as low as it can be ignored (see FIG. 2E).

In this manner, the signal amplifier 100 relating to the first embodiment does not amplify the noise SG1(AC) of the signal ground potential SG1, but amplifies only the minute analog signal Vin(AC). Thus, according to this embodiment, it is possible to generate a high-quality amplified signal Vout(AC) with extremely limited influences of noises.

[Second Embodiment]

The second embodiment will be described with reference to FIG. 5 and FIG. 6.

Figure 5:
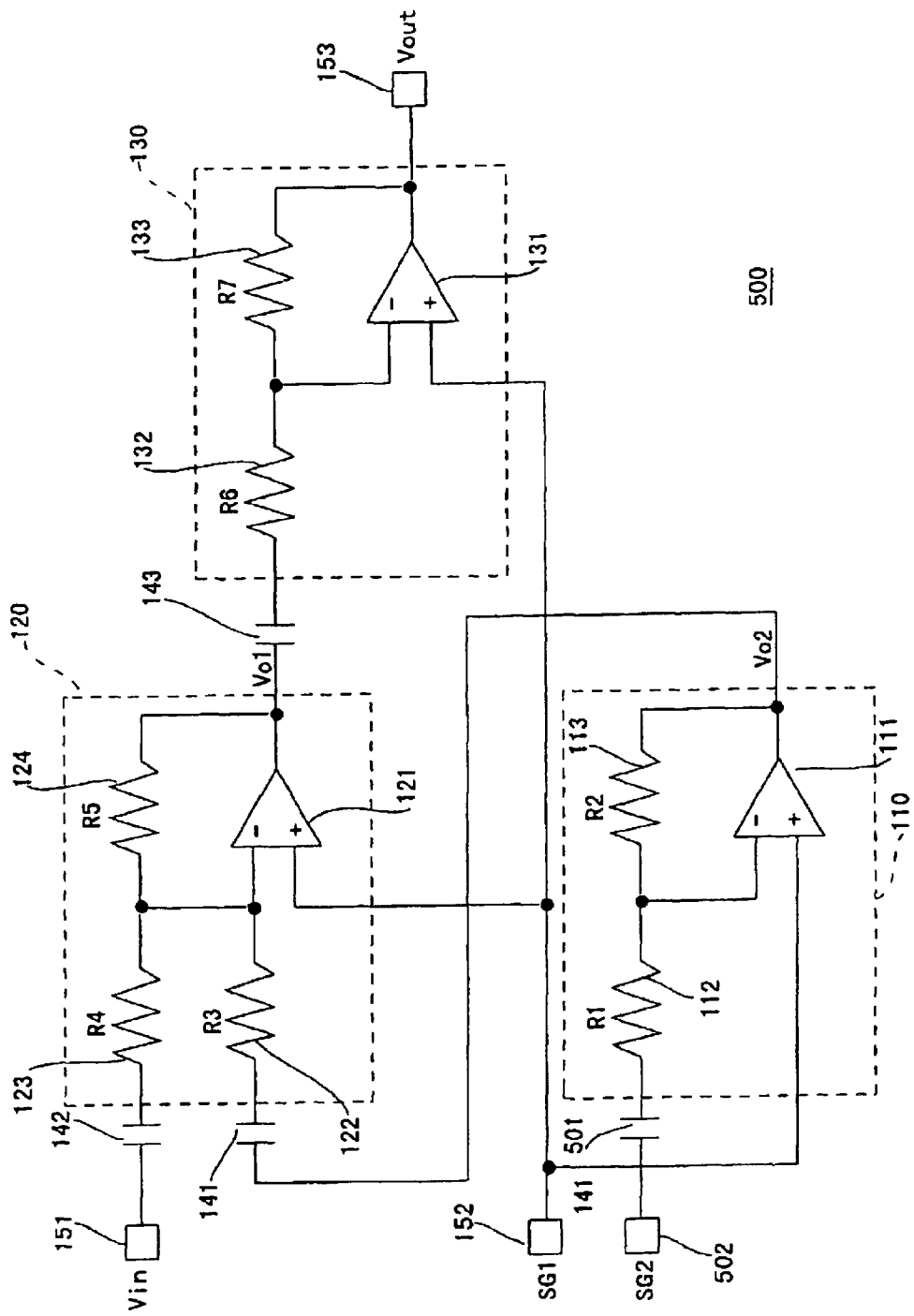
FIG. 5 illustrates a circuit configuration of a signal amplifier relating to a second embodiment.

FIG. 5 illustrates a circuit configuration of a signal amplifier relating to the second embodiment. In FIG. 5, the components given the same symbols as those in FIG. 1 each show the same ones as those of the circuit in FIG. 1.

The signal amplifier 500 relating to the second embodiment differs from the signal amplifier 100 relating to the first embodiment, in a point that the signal amplifier 500 is configured not to amplify both the noises of signal ground potentials SG1 and SG2. Here, the signal ground potential SG2 is the signal ground potential of a minute analog signal generator (not illustrated).

In the signal amplifier 500 in FIG. 5, the resistor 112 is connected to the inverted input terminal of the operational amplifier 111 at one end thereof, and the other end thereof is connected to one end of a capacitor 501. The other end of the capacitor 501 is connected to a signal ground potential input terminal 502.

In the same manner as the first embodiment, the resistances R1 through R5 of the resistors 112, 113, 122, 123, and 124 are determined so as to satisfy the expression (1).

The operational theory of the signal amplifier illustrated in FIG. 5 will now be explained.

At first, let's discuss a case that the signal ground potential SG2 has noises superposed and the signal ground potential SG1 does not have noises superposed. In this case, the noise amplifier 110 is equivalent to an inverted amplifier that amplifies the AC signal SG2(AC). Therefore, the AC component Vo2(AC) at the output Vo2 of the noise amplifier 110 is given by the following expression (13).

$$\text{Vo2(AC)} = -R2/R1 \times SG2(AC) \tag{13}$$

Here, let's consider a case that the amplitude of the AC component Vin(AC) of the minute analog signal is zero, the amplitude of the non-inverted input SG1(AC) of the operational amplifier 121 is zero, and the amplitude of the signal Vo2(AC) is not zero. In this case, the adding amplifier 120 is equivalent to an inverted amplifier that amplifies the signal Vo2(AC). Therefore, the output AC component Vo1(AC) is given by the following expression (14).

$$\text{Vo1(AC)} = -R5/R3 \times \text{Vo2(AC)} = R5/R3 \times R2/R1 \times SG2(AC) \tag{14}$$

Next, let's consider a case that the AC component Vin(AC) of the minute analog signal has the noise SG2(AC) superposed, the amplitude of the non-inverted input SG1 (AC) of the operational amplifier 121 is zero, and the amplitude of the signal Vo2(AC) is zero. In this case, the adding amplifier 120 is equivalent to an inverted amplifier that amplifies the AC signal Vin(AC) plus SG2(AC). Therefore, the output AC component Vo1(AC) is given by the following expression (15).

$$Vo1(AC)=-R5/R4\times Vin(AC)+SG2(AC)) \qquad (15)$$

When the signal ground potential SG1 does not have noises superposed, the output AC component Vo1(AC) of the adding amplifier 120 is given by the sum of the right sides of the expressions (14) and (15). That is, the output AC component Vo1(AC) is given by the following expression (16).

$$Vo1(AC)=-R5/R4\times Vin(AC)+(R5/R3+R2/R-R5/R4)\times SG2(AC) \qquad (16)$$

Here, R3//R4 is given by the following expression (17). By substituting the expression (17) for the expression (1) and further transforming the expression (1), the following expression (18) will be induced. Transforming the expression (18) will produce the expression (19).

$$R3//R4=1/(1/R3+1/R4)=(R3\cdot R4)/(R3+R4) \qquad (17)$$

$$R1\cdot R3=R2\cdot R4 \qquad (18)$$

$$R5/R3\times R2/R1=R5/R4 \qquad (19)$$

Therefore, by substituting the expression (19) for the expression (16), the output AC component Vo1(AC) of the adding amplifier 120 is given by the following expression (20).

$$Vo1(AC)=-R5/R4\times Vin(AC) \qquad (20)$$

The expression (20) shows that the influence of the noises of the signal ground potential SG2 is completely eliminated from the output of the inverted amplifier 120.

When the signal ground potential SG1 does not have noises superposed, the amplifier 130 operates as an inverted amplifier that amplifies the signal Vo1(AC). Therefore, the output Vout(AC) of the signal amplifier 500 is given by the following expression (21).

$$Vout(AC)=-R7/R6\times Vo1(AC)=R5/R4\times R7/R6\times Vin(AC) \qquad (21)$$

Thus, the influence of the noises of the signal ground potential SG2 is completely eliminated, and the signal amplifier 500 amplifies only the minute analog signal Vin.

Next, let's discuss a case that the signal ground potential SG1 has noises superposed, and the signal ground potential SG2 does not have noises superposed. In this case, the signal amplifier 500 is equivalent to the signal amplifier 100 relating to the first embodiment. Therefore, the AC component Vout (AC) of the output signal Vout is given by the expression (12).

From the above facts, it is concluded that the output AC component Vout(AC) of the signal amplifier 500 can be given by the expression (12), when both the signal ground potentials SG1 and SG2 have noises superposed. That is, the signal amplifier 500 relating to the second embodiment does not amplify the signal ground potential SG1, and completely eliminates the signal ground potential SG2.

Next, the simulation result of operations of the signal amplifier 500 relating to the second embodiment will be explained.

Figure 6:
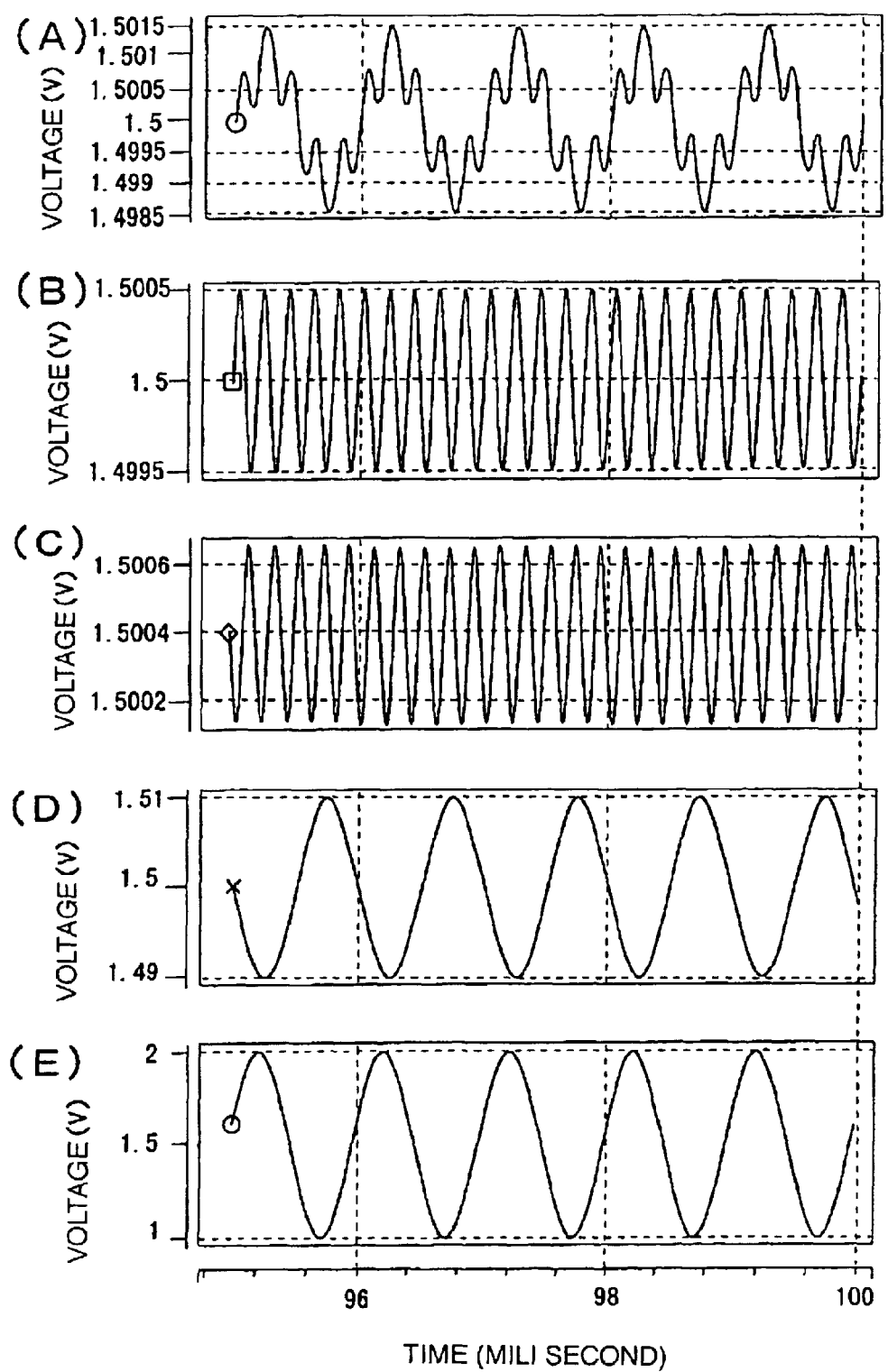
FIG. 6A through FIG. 6E illustrate signal waveforms showing a simulation result of operations of the signal amplifier relating to the second embodiment.

FIG. 6 is to explain the simulation result of operations of the signal amplifier 500 relating to the second embodiment, in which FIG. 6A illustrates a waveform of the minute analog signal Vin, FIG. 6B a waveform of the signal ground potential SG2, FIG. 6C an output waveform of the noise amplifier 110, FIG. 6D an output waveform of the adding amplifier 120, and FIG. 6E a waveform of the output signal Vout. In FIG. 6A through FIG. 6E, the horizontal axis represents the time, and the vertical axis represents the voltage. This simulation assumed that the signal ground potential SG1 does not have noises superposed. The simulation in FIG. 6 applied the sine wave of the frequency 1 kHz and the amplitude 2 mV to the minute analog signal Vin. As to the signal ground potential SG2, the DC component was set to 1.5 V, and the AC component (noises) was made up with the frequency 5 kHz and the amplitude 1 mV. Further, the resistances of the resistors were set as: R1=200 kΩ, R2=100 kΩ, R3=10 kΩ, R4=20 kΩ, R5=200 kΩ, R6=10 kΩ, and R7=500 kΩ.

When the noises are superposed on the signal ground potential SG2 (see FIG. 6B), the minute analog signal Vin also has the same noises superposed (see FIG. 6A). The amplifier 110 amplifies the noises of the signal ground potential SG2 (see FIG. 6C). The adding amplifier 120 superposes the noises amplified by the amplifier 110 on the minute analog signal Vin, and thereafter amplifies the superposed. Thereby, the influence of the noises is completely eliminated. Accordingly, the output Vo1 of the adding amplifier 120 forms a waveform that does not have any distortions at all (see FIG. 6D). And, the noises do not affect the output signal Vout of the amplifier 130 in the least (see FIG. 6E).

In this manner, the signal amplifier 500 relating to the second embodiment is able to completely eliminate the influence of the signal ground potential SG2. The signal amplifier 500 relating to the second embodiment does not amplify the noise SG1(AC) of the signal ground potential SG1 in the same manner as the signal amplifier 100 relating to the first embodiment, but amplifies only the minute analog signal Vin(AC). Thus, according to this embodiment, it is possible to generate a high-quality amplified signal Vout (AC) with extremely limited influences of noises.

In the second embodiment, it is assumed that the non-inverted input terminal of the operational amplifier Ill inputs the signal ground potential SG1. However, the non-inverted input terminal can be grounded as a modified example. In this case, a signal amplifier can be attained which eliminates only the influence of the signal ground potential SG2.

The first and second embodiments provide one stage of the amplifier 130, however the effect of the invention can be achieved without this amplifier 130. The same effect of the invention can be achieved also in a case that provides more than two stages of the amplifier 130.

As the embodiments have been described in detail, according to the signal amplifier relating to the invention, a high-quality amplification can be achieved with the influence of noises eliminated.

What is claimed is:

1. A signal amplifier comprising:
    a noise amplifier that amplifies a difference between a first ground potential and a second ground potential; and
    an adding amplifier that adds an analog input signal and an output potential of the noise amplifier, and amplifies a difference between a potential of the added analog input signal and the output potential of the noise amplifier, and the first ground potential.

2. The signal amplifier as claimed in claim 1, wherein the first ground potential is a signal ground potential of the noise amplifier and the adding amplifier, and the second ground potential is the zero-volt potential.

3. The signal amplifier as claimed in claim 1, wherein the first ground potential is a signal ground potential of the noise amplifier and the adding amplifier, and the second ground potential is a signal ground potential of a circuit that generates the analog input signal.

4. The signal amplifier as claimed in claim 1, wherein the first ground potential is the zero-volt potential, and the second ground potential is a signal ground potential of a circuit that generates the analog input signal.

5. The signal amplifier as claimed in claim 1, wherein:

the noise amplifier is a non-inverted amplifier provided with a first operational amplifier having: a non-inverted input terminal that inputs the first ground potential, an inverted input terminal that inputs the second ground potential through a first resistor, and an output terminal that is connected to the inverted input terminal through a second resistor; and the adding amplifier is an inverted adding amplifier provided with a second operational amplifier having: a non-inverted input terminal that inputs the first ground potential, an inverted input terminal that inputs an output voltage of the noise amplifier through a third resistor and inputs the analog input signal through a fourth resistor, and an output terminal that is connected to the inverted input terminal through a fifth resistor.

6. The signal amplifier as claimed in claim 2, wherein:

the noise amplifier is a non-inverted amplifier provided with a first operational amplifier having: a non-inverted input terminal that inputs the first ground potential, an inverted input terminal that inputs the second ground potential through a first resistor, and an output terminal that is connected to the inverted input terminal through a second resistor; and the adding amplifier is an inverted adding amplifier provided with a second operational amplifier having: a non-inverted input terminal that inputs the first ground potential, an inverted input terminal that inputs an output voltage of the noise amplifier through a third resistor and inputs the analog input signal through a fourth resistor, and an output terminal that is connected to the inverted input terminal through a fifth resistor.

7. The signal amplifier as claimed in claim 3, wherein:

the noise amplifier is a non-inverted amplifier provided with a first operational amplifier having: a non-inverted input terminal that inputs the first ground potential, an inverted input terminal that inputs the second ground potential through a first resistor, and an output terminal that is connected to the inverted input terminal through a second resistor; and the adding amplifier is an inverted adding amplifier provided with a second operational amplifier having: a non-inverted input terminal that inputs the first ground potential, an inverted input terminal that inputs an output voltage of the noise amplifier through a third resistor and inputs the analog input signal through a fourth resistor, and an output terminal that is connected to the inverted input terminal through a fifth resistor.

8. The signal amplifier as claimed in claim 4, wherein:

the noise amplifier is a non-inverted amplifier provided with a first operational amplifier having: a non-inverted input terminal that inputs the first ground potential, an inverted input terminal that inputs the second ground potential through a first resistor, and an output terminal that is connected to the inverted input terminal through a second resistor; and the adding amplifier is an inverted adding amplifier provided with a second operational amplifier having: a non-inverted input terminal that inputs the first ground potential, an inverted input terminal that inputs an output voltage of the noise amplifier through a third resistor and inputs the analog input signal through a fourth resistor, and an output terminal that is connected to the inverted input terminal through a fifth resistor.

9. The signal amplifier as claimed in claim 5, wherein resistances R1 through R5 of the first through fifth resistors have the relation of the following expression:

$$R5/(R3//R4)=(R5/R3)\times(1+R2/R1).$$

10. The signal amplifier as claimed in claim 6, wherein resistances R1 through R5 of the first through fifth resistors have the relation of the following expression:

$$R5/(R3//R4)=(R5/R3)\times(1+R2/R1).$$

11. The signal amplifier as claimed in claim 7, wherein resistances R1 through R5 of the first through fifth resistors have the relation of the following expression:

$$R5/(R3//R4)=(R5/R3)\times(1+R2/R1).$$

12. The signal amplifier as claimed in claim 8, wherein resistances R1 through R5 of the first through fifth resistors have the relation of the following expression:

$$R5/(R3//R4)=(R5/R3)\times(1+R2/R1).$$

13. The signal amplifier as claimed in claim 1, further comprising an amplifier of one or more stages that amplifies a difference between an output voltage of the adding amplifier and the first ground potential.

14. The signal amplifier as claimed in claim 2, further comprising an amplifier of one or more stages that amplifies a difference between an output voltage of the adding amplifier and the first ground potential.

15. The signal amplifier as claimed in claim 3, further comprising an amplifier of one or more stages that amplifies a difference between an output voltage of the adding amplifier and the first ground potential.

16. The signal amplifier as claimed in claim 4, further comprising an amplifier of one or more stages that amplifies a difference between an output voltage of the adding amplifier and the first ground potential.

17. The signal amplifier as claimed in claim 5, further comprising an amplifier of one or more stages that amplifies a difference between an output voltage of the adding amplifier and the first ground potential.

18. The signal amplifier as claimed in claim 6, further comprising an amplifier of one or more stages that amplifies a difference between an output voltage of the adding amplifier and the first ground potential.

19. The signal amplifier as claimed in claim 7, further comprising an amplifier of one or more stages that amplifies a difference between an output voltage of the adding amplifier and the first ground potential.

20. The signal amplifier as claimed in claim 8, further comprising an amplifier of one or more stages that amplifies a difference between an output voltage of the adding amplifier and the first ground potential.

21. The signal amplifier as claimed in claim 9, further comprising an amplifier of one or more stages that amplifies a difference between an output voltage of the adding amplifier and the first ground potential.

22. The signal amplifier as claimed in claim 10, further comprising an amplifier of one or more stages that amplifies a difference between an output voltage of the adding amplifier and the first ground potential.

23. The signal amplifier as claimed in claim 11, further comprising an amplifier of one or more stages that amplifies a difference between an output voltage of the adding amplifier and the first ground potential.

24. The signal amplifier as claimed in claim 12, further comprising an amplifier of one or more stages that amplifies a difference between an output voltage of the adding amplifier and the first ground potential.

* * * * *